United States Patent
Xie et al.

(10) Patent No.: US 9,704,448 B2
(45) Date of Patent: Jul. 11, 2017

(54) ARRAY SUBSTRATE, DISPLAY PANEL AND REPAIRING METHOD THEREOF

(71) Applicant: BOE Technology Group Co., Ltd., Beijing (CN)

(72) Inventors: Hongjun Xie, Beijing (CN); Kun Cao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 32 days.

(21) Appl. No.: 14/775,371

(22) PCT Filed: Nov. 28, 2014

(86) PCT No.: PCT/CN2014/092444
§ 371 (c)(1),
(2) Date: Sep. 11, 2015

(87) PCT Pub. No.: WO2016/011756
PCT Pub. Date: Jan. 28, 2016

(65) Prior Publication Data
US 2016/0203782 A1    Jul. 14, 2016

(30) Foreign Application Priority Data
Jul. 24, 2014    (CN) .......................... 2014 1 0356350

(51) Int. Cl.
*G09G 3/36*    (2006.01)
*G02F 1/1362*    (2006.01)
(Continued)

(52) U.S. Cl.
CPC ......... *G09G 3/3677* (2013.01); *G02F 1/1362* (2013.01); *G09G 3/006* (2013.01);
(Continued)

(58) Field of Classification Search
CPC .......... G09G 3/20; G09G 3/32; G09G 3/3266; G09G 3/36; G09G 3/3677; G09G 3/006;
(Continued)

(56) References Cited

U.S. PATENT DOCUMENTS 7,580,108 B2*    8/2009    Chang ............... G02F 1/136259
                                                             349/192
8,976,331 B2*    3/2015    Chang ............... G02F 1/136259
                                                             349/192
(Continued)

FOREIGN PATENT DOCUMENTS

CN    101004498 A    7/2007
CN    101487935 A    7/2009
(Continued)

OTHER PUBLICATIONS

Translation of CN103928003 (A).*
(Continued)

*Primary Examiner* — Vijay Shankar
(74) *Attorney, Agent, or Firm* — Banner & Witcoff, Ltd.

(57) ABSTRACT

An array substrate, a display panel and a repairing method thereof are provided. In the array substrate, except the last gate line, both ends of each of the remaining gate lines are provided respectively with first leads connected to the gate line; in each group of gate integrated drive circuits, except a first level shift register, an input terminal of every other shift register is provided with a second lead connected to the input terminal; the first lead connected to one of the gate lines and the second lead connected to an input terminal of the shift register at the next level adjacent thereto have an overlapping area (A) therebetween, and are insulated from each other.

18 Claims, 5 Drawing Sheets

(51) Int. Cl.
*G09G 3/00* (2006.01)
*G09G 3/3266* (2016.01)
*G11C 19/00* (2006.01)
*G09G 3/20* (2006.01)
*G09G 3/32* (2016.01)
*H01L 27/32* (2006.01)

(52) U.S. Cl.
CPC ............... *G09G 3/20* (2013.01); *G09G 3/32* (2013.01); *G09G 3/3266* (2013.01); *G09G 3/36* (2013.01); *G11C 19/00* (2013.01); *H01L 27/32* (2013.01); *G09G 2310/021* (2013.01); *G09G 2310/0286* (2013.01); *G09G 2330/08* (2013.01); *G09G 2330/12* (2013.01)

(58) Field of Classification Search
CPC ......... G09G 2310/021; G09G 2330/12; G09G 2310/0286; G09G 2330/08
USPC .................................. 345/87–100, 204–215
See application file for complete search history.

(56) References Cited

U.S. PATENT DOCUMENTS

| | | | |
|---|---|---|---|
| 9,164,344 B2 * | 10/2015 | Chang | G02F 1/136259 |
| 9,268,187 B2 * | 2/2016 | Chang | G02F 1/136259 |
| 9,384,686 B2 * | 7/2016 | Liang | G11C 19/184 |
| 2007/0164972 A1 * | 7/2007 | Chang | G09G 3/3677 345/100 |
| 2015/0109285 A1 * | 4/2015 | Liang | G11C 19/184 345/214 |

FOREIGN PATENT DOCUMENTS

| | | |
|---|---|---|
| CN | 101533621 A | 9/2009 |
| CN | 101577106 A | 11/2009 |
| CN | 103928003 A | 7/2014 |
| JP | 0683286 A | 3/1994 |
| JP | 2011033846 A | 2/2011 |
| KR | 20050105600 A | 11/2005 |
| KR | 100569276 B1 | 4/2006 |
| KR | 20070077680 A | 7/2007 |

OTHER PUBLICATIONS

May 10, 2016—(CN) Second Office Action Appn 201410356350.1 with English Tran.
Apr. 24, 2015—International Search Report and Written Opinion Appn PCT/CN2014/092444 with English Tran.
Feb. 2, 2016—(CN)—First Office Action Appn 201410356350.1with English Tran.

* cited by examiner

ARRAY SUBSTRATE, DISPLAY PANEL AND REPAIRING METHOD THEREOF

The application is a U.S. National Phase Entry of International Application No. PCT/CN2014/092444 filed on Nov. 28, 2014, designating the United States of America and claiming priority to Chinese Patent Application No. 201410356350.1, filed on Jul. 24, 2014. The present application claims priority to and the benefit of the above-identified applications and the above-identified applications are incorporated by reference herein in their entirety.

TECHNICAL FIELD

Embodiments of the present invention relate to an array substrate, a display panel and a repairing method thereof.

BACKGROUND

At present, the display technology has been widely applied to display of televisions, cell phones and public information, and display panels useful for displaying pictures are also diverse, and are capable of displaying rich and colorful pictures. However, no matter it is a thin film transistor liquid crystal display panel (TFT-LCD) or an organic light emitting display panel (OLED), they all need to be controlled by drive integrated circuits (ICs). Functions of line sequence scanning and frame-by-frame refresh are achieved by taking control of a display panel with driving ICs, so that image data input to the display panel can be refreshed in real time, and then the dynamic display is realized. A source drive IC is responsible for receiving image data, and for caching of image data and conversion from digital signals to analog signals, and eventually, the converted signals will be transmitted to data lines of the display panel by an output buffer. A gate drive IC is responsible for the implementation of progressive scanning, and gate-line scan signals for turning on row by row are generated by it for the purpose of timing control. Pixel switches will be turned on under the control of a gate-line scan signal for each row after it is applied to a corresponding gate line, so that image data enter storage capacitors of pixels in this row, and the normal display of an image is finally realized.

Generally, the design of a gate drive IC is relatively simple, and its function is relatively single. With the development of flat panel display technology, those skilled in the art start to exploit an edge of a display panel for establishment of a gate integrated drive circuit, so as to realize the function of a gate drive IC. With such a design, the separate provision of a gate drive IC in a frame region of the display panel can be omitted, in favor of the realization of a narrow frame design of the display panel, and meanwhile the production cost of related products is reduced.

A gate integrated drive circuit includes a plurality of shift registers, each of which corresponds to one gate line, and which are arranged in series, and a trigger signal that is transferred level by level exists between two adjacent shift registers. After a trigger signal is received by each shift register, it outputs a gate-line scan signal to a corresponding gate line, and transmits the trigger signal to a unit circuit at the next level. However, in the actual application process of shift registers, owing to existence of tiny particles, or improper arrangement of an interlayer circuit in the production process of a display panel, the following situation may occur: a trigger signal cannot be generated by a shift register at a certain level, or an error trigger signal is output by a shift register at a certain level. This will result in the fact that all shift registers subsequent to this level cannot receive a correct trigger signal, giving rise to interruption of scanning of the display panel, and consequently, full-screen scanning of the display panel cannot be realized.

Aiming at the problem that the interruption of scanning easily occurs to shift registers, such a manner that gate integrated drive circuits are bilaterally arranged is adopted in the prior art. That is, as illustrated in FIG. 1, one group of gate integrated drive circuits is provided at either end of gate lines, respectively, shift registers in each group of gate integrated drive circuits are connected to corresponding ones of ends of gate lines, and two shift registers are used for jointly driving one gate line, so as to ameliorate the problem that the interruption of scanning easily occurs to shift registers. If the interruption of scanning occurs to a shift register at one end of a gate line, then a shift register at the other end of the gate line outputs a scan signal to the gate line. However, a hidden danger of being unable to run full-screen scanning cannot be completely eliminated by this bilateral arrangement manner stated above, and the reason is that the problem of scanning interruption may occur to a shift register at either end of the gate line. For example, as illustrated in FIG. 1, when a second level shift register in gate integrated drive circuits at either end of gate lines cannot normally output a trigger signal to the next level in its neighborhood, every shift register subsequent to the second level shift register cannot receive the trigger signal, and in turn, cannot output a scan signal to a gate line connected thereto, and thus, full-screen scanning cannot be realized by the display panel. Therefore, which row the display panel can be successively scanned through is dependent on which one of two ends of gate lines has more shift registers for successively and normally driving the gate line scanning. So, full-screen scanning of the display panel is still unable to be guaranteed in such a way that gate integrated drive circuits are bilaterally arranged.

Hence, how the full-screen scanning of a display panel can be effectively guaranteed is an urgent problem to be solved by those skilled in the art.

SUMMARY

According to an embodiment of the invention, there is provided an array substrate, comprising a plurality of gate lines and two groups of gate integrated drive circuits respectively provided at both ends of each of the gate lines; each group of gate integrated drive circuits includes shift registers corresponding to the gate lines on a one-to-one basis, an output terminal of each of the shift registers is connected to a corresponding gate line, and except the shift register at a last level, the output terminal of each of the remaining shift registers is also connected to an input terminal of the shift register at a next level adjacent to it; except a last one of the gate lines, both ends of each of the remaining gate lines are provided respectively with first leads connected to the gate line; in each group of gate integrated drive circuits, except a first level shift register, the input terminal of each of the remaining shift registers is provided with a second lead connected to the input terminal; one of the first leads connected to one of the gate lines and one of the second leads connected to the input terminals of the shift registers at the next level adjacent thereto have an overlapping area therebetween, and are insulated from each other.

In an embodiment, in the above array substrate provided by embodiments of the invention, the first leads and the gate lines are disposed in a same layer, and the second leads and data lines in the array substrate are disposed in a same layer.

In an embodiment, in the above array substrate provided by embodiments of the invention, the second leads and the gate lines are disposed in a same layer, and the first leads and data lines in the array substrate are disposed in a same layer.

In an embodiment, in the above array substrate provided by embodiments of the invention, the overlapping area between the first lead and the second lead lies in a region outside the gate line and the input terminal of the shift register.

In an embodiment, in the above array substrate provided by embodiments of the invention, for the shift registers in each group of gate integrated drive circuits, except the first one of the shift registers, the output terminal of each of the remaining shift registers is also connected to a reset terminal of the shift register at the previous level adjacent to it; and the output terminal of the last one of the shift registers is also connected to a reset terminal of the shift register at a current level.

In an embodiment, in the above array substrate provided by embodiments of the invention, the plurality of gate lines are disposed in parallel to each other.

According to an embodiment of the invention, there is provided a display panel, comprising the above array substrate provided by embodiments of the invention.

According to an embodiment of the invention, there is provided a repairing method of the display panel comprising: determining whether the output terminal of each of the shift registers except for the last level shift register in each group of gate integrated drive circuits of the display panel outputs a gate scan signal to the gate line connected to it; if it is determined that the gate scan signal output from the output terminal of one of the shift registers to the gate line connected thereto is interrupted, laser fusing the first lead for the gate line that is connected to the shift register, to which interruption occurs, and the second lead connected to the input terminal of the shift register at the next level at the overlapping area.

In an embodiment, in the repairing method of the above display panel provided by embodiments of the invention, the following step is further included: if it is determined that the gate scan signal outputted from the output terminal of one of the shift registers to the gate line connected thereto is interrupted, cutting off connection between the output terminal of the shift register, to which interruption occurs, and the input terminal of the shift register at the next level adjacent thereto.

In an embodiment, in the repairing method of the above display panel provided by embodiments of the invention, the following step is further included: if it is determined that the gate scan signal outputted from the output terminal of one of the shift registers to the gate line connected thereto is interrupted, cutting off connection between the output terminal of the shift register, to which interruption occurs, and a reset terminal of the shift register at the previous level adjacent thereto.

With respect to the array substrate, the display panel and the repairing method thereof provided by embodiments of the invention, except the last gate line, both ends of each of the remaining gate lines are provided respectively with first leads connected to the gate line; in each group of gate integrated drive circuits, except a first level shift register, an input terminal of every other shift register is provided with a second lead connected to the input terminal; there is an overlapping area between a first lead connected to a gate line and a second lead connected to an input terminal of a shift register at the next level adjacent thereto, and the two are insulated from each other. As such, during scanning of the display panel, if output of a scan signal from output terminal(s) of one or more shift registers to the connected gate line(s) is interrupted, then a first lead for a gate line that is connected to the shift register, to which interruption occurs, and a second lead connected to an input terminal of a shift register at the next level can be laser fused at the overlapping area, so that a signal on the gate line is transferred as a trigger signal to the shift register at the next level. Thus, the smooth progress of line sequence scanning of the display panel is ensured, and full-screen scanning of the display panel is eventually realized.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but are not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

Figure 1:
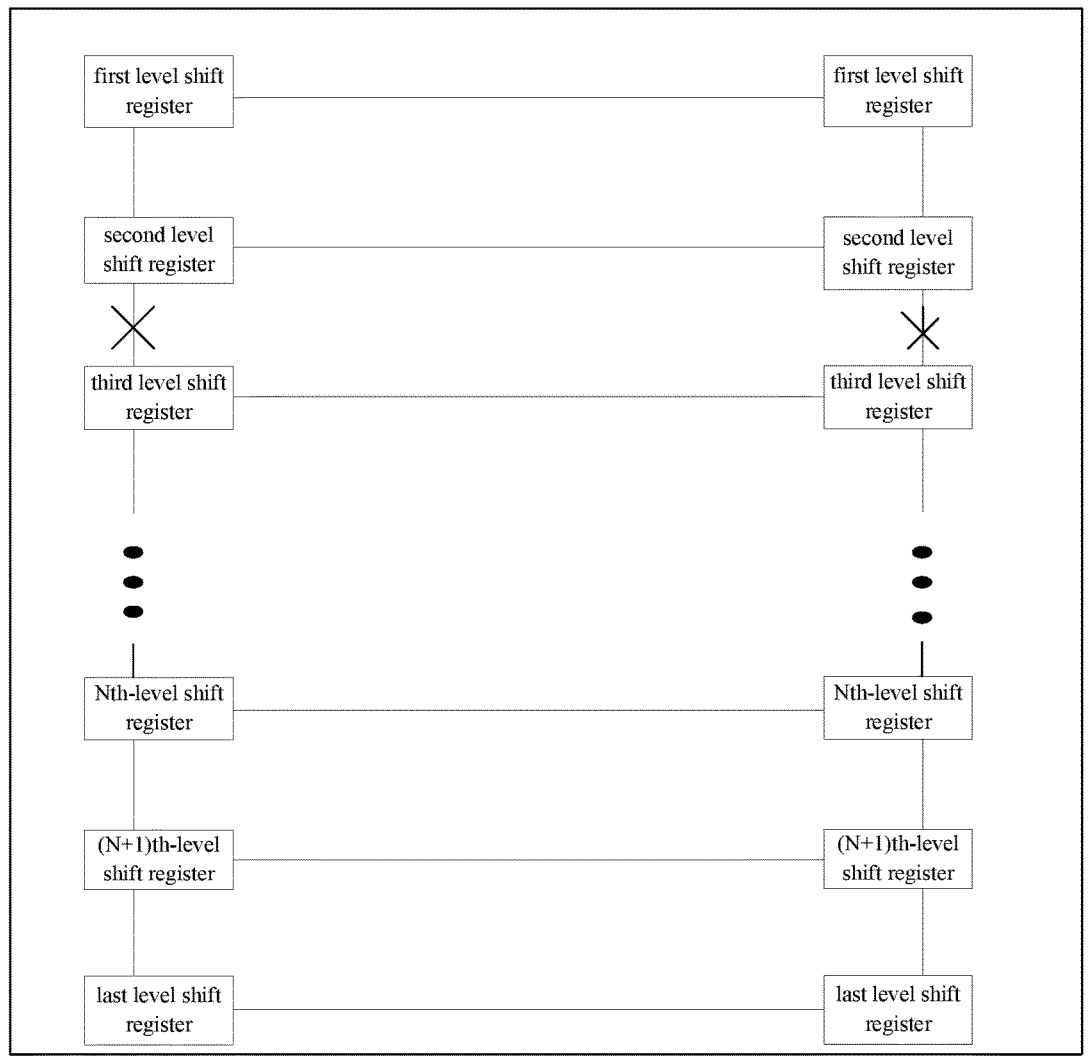
FIG. 1 is a structurally schematic view illustrating an array substrate with bilaterally arranged gate drive integrated circuits in prior art.
Figure 2:
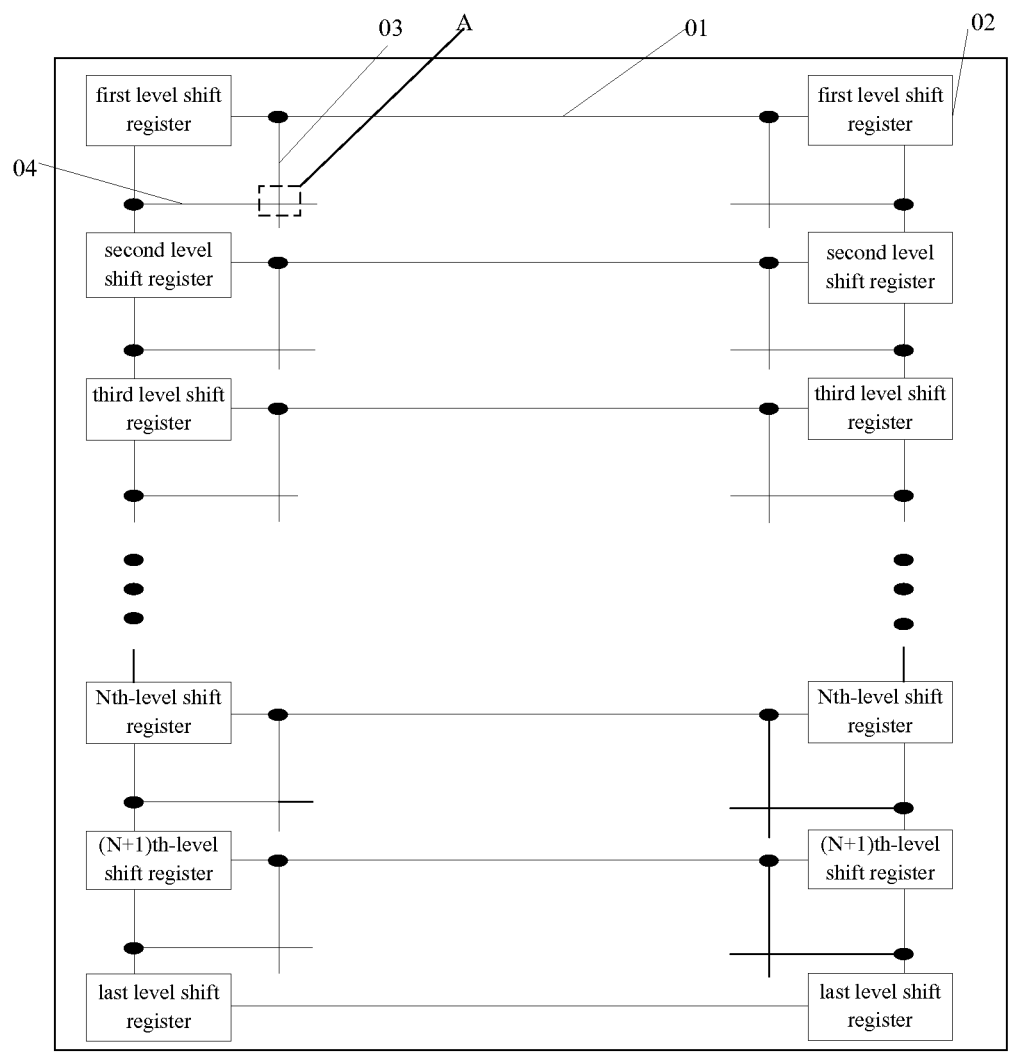
FIG. 2 is a structurally schematic view 1 illustrating an array substrate provided by an embodiment of the invention.

According to an embodiment of the invention, there is provided an array substrate. As illustrated in FIG. 2, it includes a plurality of gate lines 01 and two groups of gate integrated drive circuits respectively provided at both ends of each of the gate lines 01. Each group of gate integrated drive circuits includes shift registers 02 corresponding to the gate lines 01 on a one-to-one basis, an output terminal of each shift register 02 is connected to a respective gate line 01, and except a shift register 02 at the last level, an output terminal of every other shift register 02 is also connected to an input terminal of a shift register 02 at the next level adjacent to it.

Except the last gate line 01, both ends of each of the remaining gate lines 01 are provided respectively with first leads 03 connected to the gate line 01.

In each group of gate integrated drive circuits, except a shift register 02 at the first level, an input terminal of every other shift register 02 is provided with a second lead 04 connected to the input terminal.

There is an overlapping area A between a first lead 03 connected to a gate line 01 and a second lead 04 connected to an input terminal of a shift register 02 at the next level adjacent thereto, and the two are insulated from each other.

For example, the plurality of gate lines 01 are disposed in parallel to each other.

For example, each group of gate integrated drive circuits includes shift registers at multiple levels, the number of levels is equal to the number of gate lines 01 here. A shift register at each level corresponds to one gate line 01, so as to drive the gate line 01. For example, it is possible that in a driving order of gate lines, shift registers 02 at respective levels are called as a first level shift register, a second level shift register, a third level shift register, ..., a Nth level shift register, a (N+1)th level shift register, ..., and a last level shift register.

In the above array substrate provided by embodiments of the invention, except the last gate line 01, both ends of each of the remaining gate lines 01 are provided respectively with first leads 03 connected to the gate line 01; in each group of gate integrated drive circuits, except a shift register 02 at the first level, an input terminal of every other shift register 02 is provided with a second lead 04 connected to the input terminal; there is an overlapping area between a first lead 03 connected to a gate line 01 and a second lead 04 connected to an input terminal of a shift register 02 at the next level adjacent thereto, and the two are insulated from each other. As such, during scanning of the display panel, if output of a scan signal from output terminal of one or more shift registers 02 to the connected gate line(s) is interrupted, then a first lead 03 for a gate line 01 that is connected to the shift register 02, to which interruption occurs, and a second lead 04 connected to an input terminal of a shift register 02 at the next level can be laser fused at the overlapping area, so that a signal on the gate line 01 is transferred as a trigger signal to the shift register 02 at the next level. Thus, the smooth progress of line sequence scanning of the display panel is ensured, and full-screen scanning of the display panel is eventually realized.

In an example, in the above array substrate provided by embodiments of the invention, the first lead 03 may be disposed in the same layer as gate lines 01, and the second lead 04 may be disposed in the same layer as data lines in the array substrate.

Or, in an example, in the above array substrate provided by embodiments of the invention, the second lead 04 may also be disposed in the same layer as gate lines 01, and the first lead 03 may also be disposed in the same layer as data lines in the array substrate.

For example, the first lead 03 and the second lead 04 may be insulated from each other by a gate insulating film between them, but embodiments in accordance with the invention are not limited to this.

In an example, in the above array substrate provided by embodiments of the invention, the first lead 03 is disposed in the same layer as gate lines 01, or disposed in the same layer as data lines; accordingly, the second lead 04 is disposed in the same layer as data lines, or disposed in the same layer as gate lines 01. As such, the first lead 03 and the second lead 04 may be formed by using an existing film layer in the array substrate, without the need of adding a new process step. Also, the first lead 03 and the second lead 04 should be disposed in different layers, respectively, so as to ensure mutual insulation between the first lead 03 and the second lead 04, and to avoid such a problem that when a shift register 02 in the display panel is normally outputting a scan signal to a gate line connected to it, the signal on the gate line 01 is transferred to a shift register 02 at the next level owing to interconnection between the first lead 03 and the second lead 04, so as to cause unnecessary interference to a trigger signal of the shift register 02 at the next level.

In an example, in the above array substrate provided by embodiments of the invention, the overlapping area between the first lead 03 and the second lead 04 may be arranged in a region located outside a gate line 01 and an input terminal of a shift register 02. As such, when the first lead 03 and the second lead 04 are fused at the overlapping area with laser, the possibility that owing to failure in laser fusion, normal operation of the gate line 01 and the shift register 02 is affected can be avoided.

Figure 3:
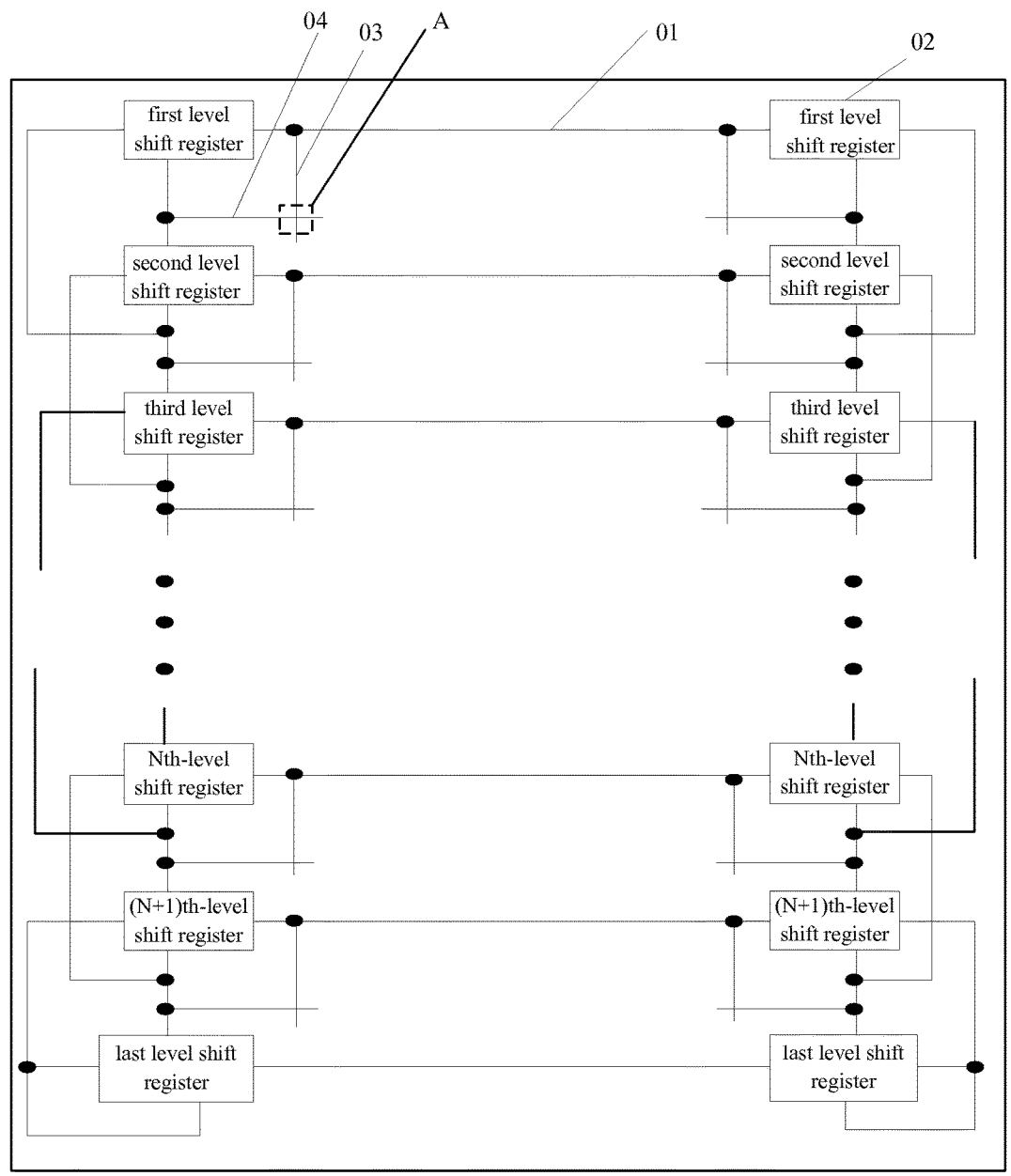
FIG. 3 is a structurally schematic view 2 illustrating an array substrate provided by an embodiment of the invention.

In an example, in the above array substrate provided by embodiments of the invention, as illustrated in FIG. 3, for shift registers 02 in each group of gate integrated drive circuits, except the first shift register 02, an output terminal of every other shift register 02 may also be connected to a reset terminal of a shift register 02 at the previous level adjacent to it; and an output terminal of the last shift register 02 is also connected to a reset terminal of a shift register 02 at the current level. As such, while full screen scan of the display panel is running, a shift register 02 also outputs a reset signal to a reset terminal of a shift register 02 at the previous level while outputting a scan signal to a gate line 01 connected to it, causing the shift register 02 at the previous level to stop working, and thereby, it is ensured that gate electrodes in the array substrate are turned on row by row.

Based on the same inventive concept, according to embodiments of the invention, there is provided a display panel, which includes the above array substrate provided by embodiments of the invention. The display panel may be a cell phone, a tablet computer, a television, a display, a notebook computer, a digital photo frame, a navigator or any other product or component having a display function. Regarding implementation of the display panel, reference to embodiments of the above array substrate can be made, and repetitions will be omitted.

Figure 4:
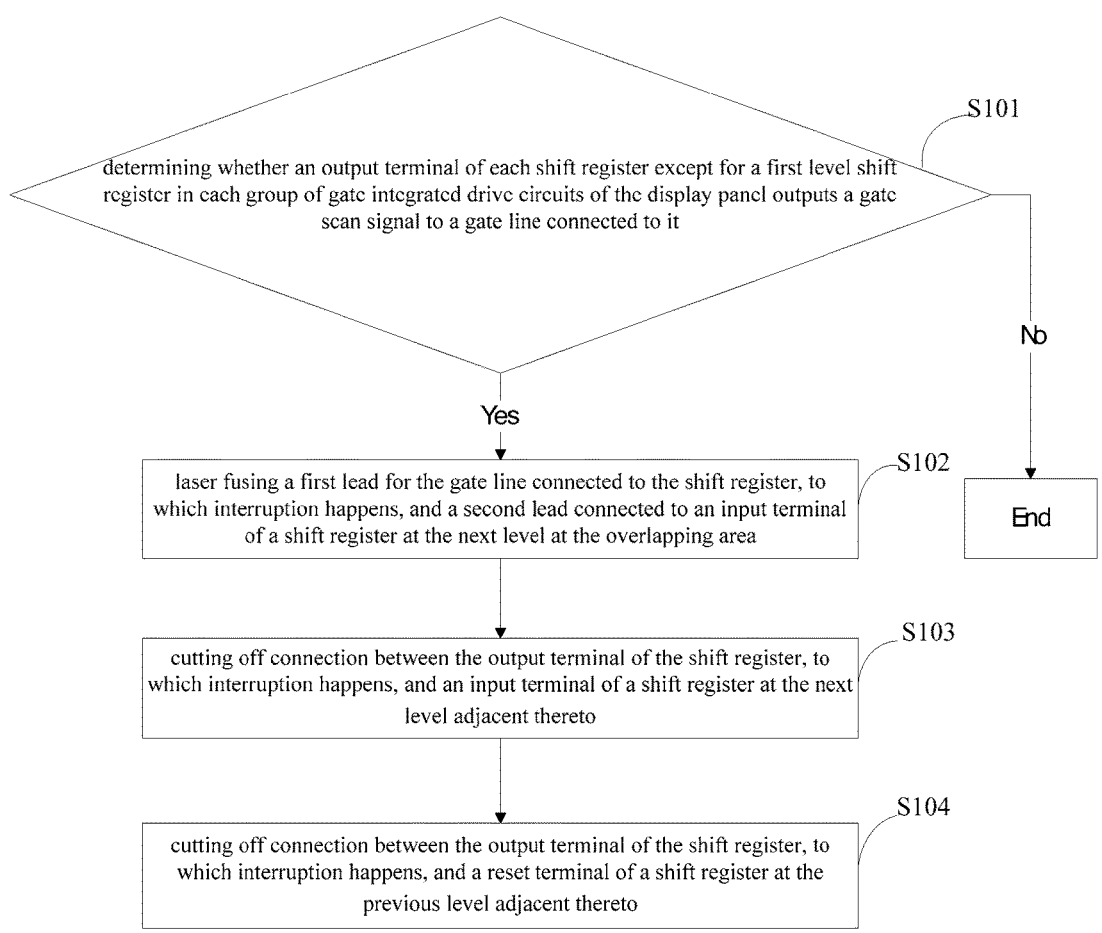
FIG. 4 is a flowchart illustrating the repairing method of a display panel provided by an embodiment of the invention.

Based on the same inventive concept, a repairing method of the above display panel is provided by an embodiment of the invention. As illustrated in FIG. 4, it includes the following steps.

S101, determining whether an output terminal of each of shift registers except for a shift register at the last level in each group of gate integrated drive circuits of the display panel outputs a gate scan signal to a gate line connected to it; and if the determination result is yes, then it proceeds to step S102; if no, then it ends. In an example, it may be determined in a lighting detection process after completion of the display panel production whether each shift register in the display panel works normally, so as to judge whether an output terminal of each shift register outputs a gate scan signal to a gate line connected to it. The concrete procedure of detection will be omitted.

Figure 5:
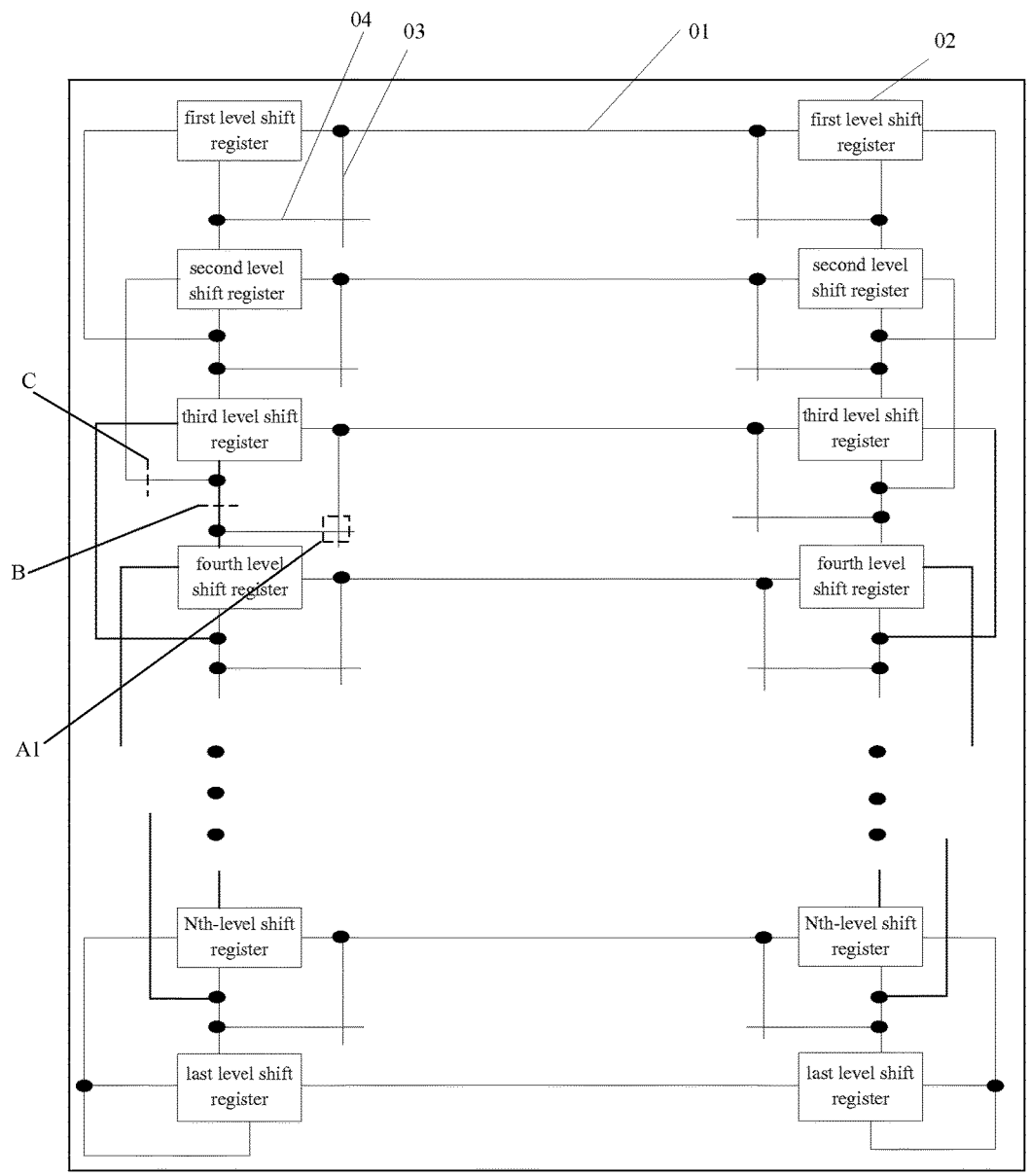
FIG. 5 is a structurally schematic view illustrating a display panel upon repair provided by an embodiment of the invention.

S102, when it is determined that a gate scan signal output from an output terminal of a shift register to a gate line connected thereto is interrupted, then a first lead for the gate line that is connected to the shift register, to which interruption occurs, and a second lead connected to an input terminal of a shift register at the next level are laser fused at the overlapping area, so that a signal on the gate line is transferred to the shift register at the next level. Thus, the smooth progress of line sequence scanning of the display panel is ensured, and full-screen scanning of the display panel is eventually realized. For example, as illustrated in FIG. 5, it can be known by test that, when an output terminal of a shift register 02 at the third level on the left side suffers from an issue, a first lead 03 for a gate line 01 connected to the shift register 02 at the third level and a second lead 04 for a shift register 02 at the fourth level may be laser fused at an overlapping area A1.

Further, the repairing method of the above display panel provided by embodiments of the invention, as illustrated in FIG. 4, may further include the following step.

S103, when it is determined that a gate scan signal output from an output terminal of a shift register to a gate line connected thereto is interrupted, connection between the output terminal of the shift register, to which interruption occurs, and an input terminal of a shift register at the next level adjacent thereto is cut off. Thus, the problem that an error signal is outputted from the output terminal of the shift register, to which scanning interruption occurs, to the input terminal of the shift register at the next level adjacent thereto, and then interferes with a signal that is transferred from a corresponding gate line to the shift register at the next level with the aid of fusion of a first lead and a second lead, is avoided. For example, as illustrated in FIG. 5, when it is determined that an output terminal of a shift register 02 at the third level on the left side suffers from an issue, connection between the output terminal of the shift register 02 at the third level and an input terminal of a shift register 02 at the fourth level adjacent thereto may be cut off, as denoted by 'B' in the figure.

Further, the repairing method of the above display panel provided by embodiments of the invention, as illustrated in FIG. 4, may further include the following step.

S104, when it is determined that a gate scan signal outputted from an output terminal of a shift register to a gate line connected thereto is interrupted, connection between the output terminal of the shift register, to which interruption occurs, and a reset terminal of a shift register at the previous level adjacent thereto is cut off. Thus, the problem that an error signal is outputted from the output terminal of the shift register, to which scanning interruption occurs, to the reset terminal of the shift register at the previous level adjacent thereto, and affects the working state of the shift register at the previous level adjacent to it, letting it output an error signal to a gate line connected thereto, is avoided. For example, as illustrated in FIG. 5, when it is determined that an output terminal of a shift register 02 at the third level on the left side suffers from an issue, connection between the output terminal of the shift register 02 at the third level and a reset terminal of a shift register 02 at the second level adjacent thereto may be cut off, as denoted by 'C' in the figure.

Steps S102 to S104 in the above method provided by embodiments of the invention are executed in a random order.

According to embodiments of the invention, there are provided an array substrate, a display panel and a repairing method thereof, wherein, except the last gate line, both ends of each of the remaining gate lines are provided respectively with first leads connected to the gate line; in each group of gate integrated drive circuits, except a first level shift register, an input terminal of every other shift register is provided with a second lead connected to the input terminal; there is an overlapping area between a first lead connected to a gate line and a second lead connected to an input terminal of a shift register at the next level adjacent thereto, and the two are insulated from each other. As such, during scanning of the display panel, if output of a scan signal from output terminal(s) of one or more shift registers to the connected gate line(s) is interrupted, then a first lead for a gate line that is connected to the shift register, to which interruption occurs, and a second lead connected to an input terminal of a shift register at the next level can be laser fused at the overlapping area, so that a signal on the gate line is transferred as a trigger signal to the shift register at the next level. Thus, the smooth progress of line sequence scanning of the display panel is ensured, and full-screen scanning of the display panel is eventually realized.

The descriptions made above are merely exemplary embodiments of the invention, but are not used to limit the protection scope of the invention. The protection scope of the invention is defined by attached claims.

This application claims the benefit of priority from Chinese patent application No. 201410356350.1, filed on Jul. 24, 2014, the disclosure of which is incorporated herein in its entirety by reference as a part of the present application.

The invention claimed is:

1. A repairing method of a display panel, wherein, the display panel comprises an array substrate comprising a plurality of gate lines and two groups of gate integrated drive circuits respectively provided at both ends of each of the gate lines; each group of gate integrated drive circuits includes shift registers corresponding to the gate lines on a one-to-one basis, an output terminal of each of the shift registers is connected to a corresponding gate line, and except the shift register at a last level, the output terminal of each of the remaining shift registers is also connected to an input terminal of the shift register at a next level adjacent to it, wherein;

except a last one of the gate lines, both ends of each of the remaining gate lines are provided respectively with first leads connected to the gate line;

in each group of gate integrated drive circuits, except a first level shift register, the input terminal of each of the remaining shift registers is provided with a second lead connected to the input terminal; and one of the first leads connected to one of the gate lines and one of the second leads connected to the input terminals of the shift registers at the next level adjacent thereto have an overlapping area therebetween, and are insulated from each other, wherein, the repairing method comprises:

determining whether the output terminal of each of the shift registers except for the last level shift register in each group of gate integrated drive circuits of the display panel outputs a gate scan signal to the gate line connected to it; and if it is determined that the gate scan signal output from the output terminal of one of the shift registers to the gate line connected thereto is interrupted, laser fusing the first lead for the gate line that is connected to the shift register, to which interruption occurs, and the second lead connected to the input terminal of the shift register at the next level at the overlapping area.

2. The method according to claim 1, further comprising, if it is determined that the gate scan signal outputted from the output terminal of one of the shift registers to the gate line connected thereto is interrupted, cutting off connection between the output terminal of the shift register, to which interruption occurs, and the input terminal of the shift register at the next level adjacent thereto.

3. The method according to claim 1, further comprising, if it is determined that the gate scan signal outputted from the output terminal of one of the shift registers to the gate line connected thereto is interrupted, cutting off connection between the output terminal of the shift register, to which interruption occurs, and a reset terminal of the shift register at the previous level adjacent thereto.

4. An array substrate, comprising a plurality of gate lines and two groups of gate integrated drive circuits respectively provided at both ends of each of the gate lines; each group of gate integrated drive circuits includes shift registers corresponding to the gate lines on a one-to-one basis, an output terminal of each of the shift registers is connected to a corresponding gate line, and except the shift register at a last level, the output terminal of each of the remaining shift registers is also connected to an input terminal of the shift register at a next level adjacent to it, wherein;

except a last one of the gate lines, both ends of each of the remaining gate lines are provided respectively with first leads connected to the gate line;

in each group of gate integrated drive circuits, except a first level shift register, the input terminal of each of the remaining shift registers configured for receiving a trigger signal is provided with a second lead connected to the input terminal; and one of the first leads connected to one of the gate lines and one of the second leads connected to the input terminals of the shift registers at the next level adjacent thereto have an overlapping area therebetween, and are insulated from each other.

5. The array substrate according to claim 4, wherein, the first leads and the gate lines are disposed in a same layer, and the second leads and data lines in the array substrate are disposed in a same layer.

6. The array substrate according to claim 4, wherein, the second leads and the gate lines are disposed in a same layer, and the first leads and data lines in the array substrate are disposed in a same layer.

7. The array substrate according to claim 4, wherein, the overlapping area between the first lead and the second lead lies in a region outside the gate line and the input terminal of the shift register.

8. The array substrate according to claim 4, wherein, for the shift registers in each group of gate integrated drive circuits, except the first one of the shift registers, the output terminal of each of the remaining shift registers is also connected to a reset terminal of the shift register at the previous level adjacent to it; and the output terminal of the last one of the shift registers is also connected to a reset terminal of the shift register at a current level.

9. The array substrate according to claim 4, wherein, the plurality of gate lines are disposed in parallel to each other.

10. A display panel, comprising the array substrate according to claim 4.

11. The array substrate according to claim 5, wherein, the overlapping area between the first lead and the second lead lies in a region outside the gate line and the input terminal of the shift register.

12. The array substrate according to claim 5, wherein, for the shift registers in each group of gate integrated drive circuits, except the first one of the shift registers, the output terminal of each of the remaining shift registers is also connected to a reset terminal of the shift register at the previous level adjacent to it; and the output terminal of the last one of the shift registers is also connected to a reset terminal of the shift register at a current level.

13. The array substrate according to claim 5, wherein, the plurality of gate lines are disposed in parallel to each other.

14. The display panel according to claim 10, wherein, the first leads and the gate lines are disposed in a same layer, and the second leads and data lines in the array substrate are disposed in a same layer.

15. The display panel according to claim 10, wherein, the second leads and the gate lines are disposed in a same layer, and the first leads and data lines in the array substrate are disposed in a same layer.

16. The display panel according to claim 10, wherein, the overlapping area between the first lead and the second lead lies in a region outside the gate line and the input terminal of the shift register.

17. The display panel according to claim 10, wherein, for the shift registers in each group of gate integrated drive circuits, except the first one of the shift registers, the output terminal of each of the remaining shift registers is also connected to a reset terminal of the shift register at the previous level adjacent to it; and the output terminal of the last one of the shift registers is also connected to a reset terminal of the shift register at a current level.

18. The display panel according to claim 10, wherein, the plurality of gate lines are disposed in parallel to each other.

* * * * *